United States Patent [19]

Brown et al.

[11] Patent Number: 5,068,319
[45] Date of Patent: Nov. 26, 1991

[54] BIZ-DIAZOTIZED DIARYL DIAMINE COUPLED DYES HAVING IMPROVED SOLUBILITY IN ORGANIC SOLVENT

[75] Inventors: David M. Brown, Charlotte, N.C.; Robert E. Potvin, Kent, R.I.

[73] Assignee: Hoechst Celanese Corporation, Somerville, N.J.

[21] Appl. No.: 502,075

[22] Filed: Mar. 29, 1990

[51] Int. Cl.$^5$ ..................... C09B 35/08; C09B 35/205
[52] U.S. Cl. .................... 534/759; 534/573; 534/581; 430/176
[58] Field of Search .......................... 534/759

[56] References Cited

U.S. PATENT DOCUMENTS

| | | | |
|---|---|---|---|
| 1,869,064 | 7/1932 | Krebser | 534/759 |
| 2,512,251 | 6/1950 | Kleene | 534/759 X |
| 4,296,028 | 10/1981 | Moiso et al. | 534/759 |
| 4,906,741 | 3/1990 | Hazen et al. | 534/856 |

FOREIGN PATENT DOCUMENTS

| | | | |
|---|---|---|---|
| 59-101607 | 6/1984 | Japan | 534/759 |
| 59-102955 | 6/1984 | Japan | 534/759 |
| 206831 | 9/1924 | Switzerland | 534/759 |

Primary Examiner—Mary C. Lee
Assistant Examiner—Fiona T. Powers
Attorney, Agent, or Firm—Andrew F. Sayko, Jr.

[57] ABSTRACT

The present invention relates to dyestuffs soluble in organic solvents having the structure:

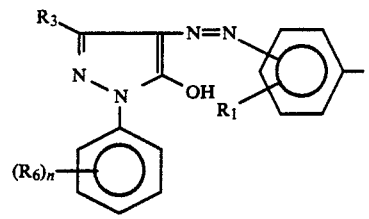

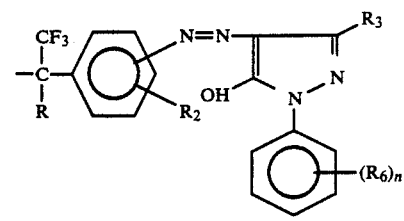

wherein R is $CF_3$ or phenyl, $R_1$ and $R_2$ are the same or different substituent groups selected from the group consisting of hydrogen, hydroxy, halogen, $C_1$ to $C_3$ alkyl and $C_1$ to $C_4$ alkoxy, $R_3$ is selected from the groups consisting of hydrogen, $C_1$ to $C_3$ alkyl, $C_1$ to $C_3$ alkoxy, COOH, and $COOR_5$ wherein $R_5$ is $C_1$ to $C_4$ alkyl, $R_6$ is selected from the group consisting of hydrogen, sulfonyl, $C_1$ to $C_3$ alkyl, $C_1$ to $C_3$ alkoxy and halogen, and n is zero or a whole number ranging from 1 to 3. The dyestuffs of the invention are useful as light absorbers or antihalation agents in photosensitive compositions. They may also be used as dyeing agents for paper, fibers or films and as components in printing ink formulations.

13 Claims, No Drawings

BIZ-DIAZOTIZED DIARYL DIAMINE COUPLED DYES HAVING IMPROVED SOLUBILITY IN ORGANIC SOLVENT

BACKGROUND OF THE INVENTION

1. Field of the Invention

The present invention relates to improved diarylide dyestuffs which exhibit improved solubility in organic solvents and which are particularly useful as light absorbers in photosensitive compositions.

2. Description of Related Art

Diazo pigments and dyestuffs are known in the art and have long been used in the preparation of printing inks and dyeing formulations. The so-called benzidine orange or yellow pigments are prepared by coupling a tetraazotized 3,3'-dichlorobenzidine with a pyrazolone-(5) coupling agent such as 1-phenyl-3-methyl-5-pyrazolone.

Most materials of this category are classified as pigments because they are generally insoluble in water as well as most organic solvents. These pigments must be ground to fine powders to form suspensions prior to use in coloring applications. This poor solubility limits the use of such materials in applications where solvent solubility is required, particularly their use as absorptive dyestuffs in solvent based photosensitive formulations such as photoresists.

Thus, the highly desirable absorption properties of these materials in the Deep UV (200-300 nm) or Near UV (300-450nm) regions of the spectrum which would make them excellent candidates as anti-halation agents or sensitizers in photosensitive applications are not advantageously used in some applications because of poor or non-existent solubility in the common organic solvents used in photosensitive formulations. Example of pigments of this type are disclosed in U.S. Pat. No. 3,776,749. Analogous pigments based on tetraazotized 4,4'-diamino-benzanilide coupled with 1-phenyl-3-methyl-5-pyrazolone are disclosed in U.S. Pat. No. 4,296,028.

Solvent soluble dyestuffs have been prepared by coupling a tetraazotized 4,4'-(hexafluoroisopropylidene) dianiline with either phenol or N-2-cyanoethyl N-ethyl m-toluidine, as disclosed in U.S. Pat. No. 3,310,573. However these dyestuffs are not disclosed to have spectral or other properties which would render them desirable as solvent soluble counterparts of the benzidine pigments referred to above.

SUMMARY OF THE INVENTION

The present invention relates to organic solvent soluble dyestuffs which are obtained by coupling a bis-diazotized diaryl diamine having a structure of the formula A:

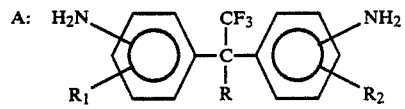

wherein R is $CF_3$, phenyl or phenyl substituted with an alkyl group of 1 to 3 carbons and $R_1$ and $R_2$ are the same or different substituent groups selected from the group consisting of hydrogen, hydroxy, halogen, $C_1$ to $C_3$ alkyl and $C_1$ to $C_4$ alkoxy; with a pyrazolen $-5$ compound having a structure of the formula B:

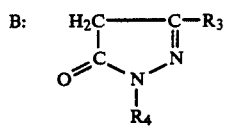

wherein $R_3$ is selected from the group consisting of hydrogen $C_1$ to $C_3$ alkyl, $C_1$ to $C_3$ alkoxy, COOH and $COOR_5$ wherein $R_5$ is $C_1$ to $C_4$ alkyl and $R_4$ is a phenyl group or a phenyl group containing from 1 to 3 ring substituents selected from $C_1$ to $C_3$ alkyl, $C_1$ to $C_3$ alkoxy or halogen.

Dyestuffs prepared in accordance with this invention may be generally characterized by a structure of the formula C:

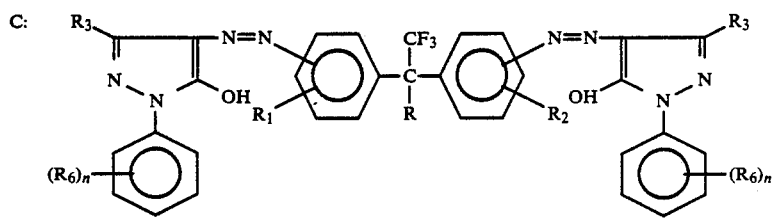

wherein R and $R_1$ to $R_3$ are as set forth above, $R_6$ is selected from the group consisting of hydrogen, sulfonyl, $C_1$ to $C_3$ alkyl, $C_1$ to $C_3$ alkoxy and halogen, and n is zero or a whole number ranging from 1 to 3.

The dyestuffs of the present invention are readily soluble in organic solvents commonly used in the preparation of photoresist compositions such as propylene glycol methyl ether, propylene glycol methyl ether acetate, diglyme, N-methyl pyrrolidinone, N-butyl acetate, tetrahydrofuran, dimethyl acetamide, cyclohexanone, cyclopentanone and similar materials. This property coupled with the fact that many species have maximum absorptions in the Deep UV and Near UV region of the spectrum render them as ideal sensitizers or anti halation components in DUV and NUV photoresist applications. They may also be used as dye components in other photosensitive compositions, as dyeing agents for paper, fibers or films and as components in printing ink formulations.

DETAILED DESCRIPTION OF THE INVENTION

In the preferred embodiments of the present invention, amino compounds within the scope of Formula A above are selected where the amino groups are either para or meta with respect to the isopropylidene linking group and any substituent $R_1$ or $R_2$ groups which may be present occupy respectively the corresponding meta or para positions with respect to the isopropylidene linking groups. In the most preferred embodiments, $R_1$ and $R_2$ are selected from hydrogen, chlorine or hydroxy, and R is $CF_3$.

Suitable diamines within the scope of the structure of Formula A set forth above which are most preferred in preparing the dyestuffs of this invention include:
2,2-bis(4-aminophenyl) hexafluoropropane;
2,2-bis(3-aminophenyl) hexafluoropropane;
2-(3-aminophenyl)-2-(4-aminophenyl) hexafluoropropane;
2,2-bis(3-amino-4-hydroxyphenyl) hexafluoropropane;
2,2-bis(4-amino-3-hydroxyphenyl) hexafluoropropane;
2,2-bis(4-amino-3-chlorophenyl) hexafluoropropane;
1,1-bis(4-aminophenyl)-1-phenyl-2,2,2- trifluoroethane; and analogously substituted or unsubstituted versions thereof within the scope of Formula 1. Mixtures of such diamines may also be employed.

The preferred bases are known diamines such as disclosed in U.S. Pat. Nos. 3,310,573, 3,356,648 and 4,592,925.

Pyrazolone-5 coupler compounds having a structure as set forth in Formula B above are preferred where $R_3$ is methyl or carboxyl.

Examples of preferred couplers include:
1-phenyl-3-methyl-pyrazolone-(5);
1-(p-tolyl)-3-methyl-pyrazolone-(5);
1-phenyl-3-ethoxycarbonyl-pyrazolone-(5);
1-phenyl-3-carboxy-pyrazolone-(5)
1-(3'-sulfonphenyl)-3-methyl-pyrazolone-(5); and other pyrazolones having similar structures.
Mixtures of such pyrazolones may also be employed.

The diazotization of the diamines corresponding to Formula A to form the tetraazonium salt may be accomplished in a known manner by means of reaction with alkali metal nitrites or lower alkyl nitrites together with adequately strong acids, particularly mineral acids such as hydrochloric acid or sulfuric acid. Diazotization may be also carried out using nitrosylsulfuric acid. In this reaction and in the subsequent coupling reaction; it may be beneficial to include a surface active agent such as a non-ionic, anionic or cationic dispersing agent.

The coupling reaction is carried out by dispersing the pyrazolone coupler component of Formula B above in an aqueous alkali solution and adding the solution to the previously prepared tetraazonium salt solution. Generally, approximately two moles or slight excess of the coupler are added per mole of the tetraazonium salt.

The following examples are illustrative of the invention.

EXAMPLE 1

This example details the preparation of dyestuff having the structure:

5.01 grams of 2,2-bis(3-aminophenyl) hexafluoropropane (hereinafter referred to as 3,3'-6F Diamine), 67 ml water, and 17.4 grams of concentrated (31.5%) hydrochloric acid are stirred together in a 500 ml beaker and cooled to 0° C. in an ice bath. To the diamine hydrochloride is added 5.6 grams of aqueous sodium nitrite (40%) solution. The mixture is kept at 0–5° C. and a positive test for nitrite concentration against Green's Reagent or potassium iodide starch paper is maintained for 1½ hours.

As the tetraazonium salt solution is being prepared, 5.75 grams 3-methyl-1-phenyl-2-pyrazolin-5-one, 200 ml water, 2.1 grams aqueous ammonia (28%) solution, and 2.8 grams aqueous sodium hydroxide (50%) solution are stirred together in a 300 ml Erlenmeyer flask.

The excess nitrite of the tretraazonium salt solution is consumed by reaction with sulfamic acid.

To the tetraazonium salt solution is added 6.8 grams sodium acetate. The pyrazolone solution is gradually dropped in until a diazo spot test against H-acid is negative. The pH is adjusted to about 7 with sodium hydroxide solution. The mixture is stirred for 15 minutes, then acidified to about pH 1 with concentrated hydrochloric acid, and stirred about 15 minutes. The product is filtered, washed with water, and dried. The yield is 10.5 grams (99% of theory). The resulting dye is soluble in Propylene Glycol Methyl Ether Acetate (PGMEA) but not in aqueous alkali.

| Properties: | |
|---|---|
| Molecular weight: | 704.62 |
| Solubility: | Soluble in PGMEA |
| UV-visible: | The absorption maxima occur at 382 and 244 nm |
| Melting Point: | Decomposes at 120° C. |
| High Performance Liquid Chromatography: | 96.1% by area-Tautomeric forms are possible. |

EXAMPLE 2

This example details the preparation of a dyestuff having the formula:

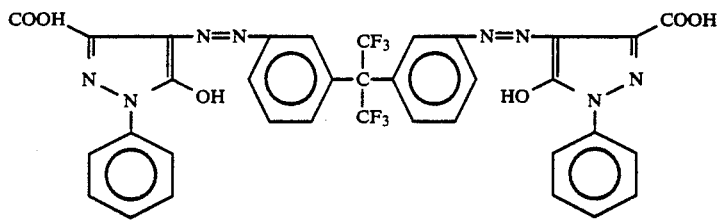

35.53 grams 3-carboxy-1-phenyl-2-pyrazolin-5-one, 100 ml water, and 26.4 grams aqueous sodium hydroxide (50%) solution are stirred together in a 250 ml Erlenmeyer flask, heated to 50° C., and held at 50° C. for two hours.

While the 3-carboxy-1-phenyl-2-pyrazolin-5-one is being prepared, 25.05 grams of the 3,3'6F diamine, 300 ml water, and 38.28 grams of concentrated (31.5%) hydrochloric acid are stirred together in a 800 ml beaker and cooled to 0° C. in an ice bath. To the diamine hydrochloride is added 28.0 grams of aqueous sodium nitrite (40%) solution. The mixture is kept at 0–5° C. and a positive test for nitrite concentration against Green's Reagent or potassium iodide starch paper is maintained for 1 hour. At the end of one hour, the excess nitrite of the tetraazonium salt solution is reacted away with sulfamic acid.

To the tetraazonium salt solution is added 8.2 grams sodium acetate. The pyrazolone solution is gradually dropped in until a diazo spot test against H-acid is negative. The mixture is acidified to a pH of about 1 with concentrated hydrochloric acid. The product is stirred for ten minutes, filtered, washed with water, and dried. The yield is 54.0 grams (94% of theory).

The dye is purified by reprecipitation. 50 grams of dye is dissolved in about 400 ml of deionized water and 24 grams sodium hydroxide (50%) solution in a 600 ml beaker. The solution is filtered and the filtrate subsequently is drowned into 1 liter 1-N hydrochloric acid. The reprecipitated dye is filtered, washed with deionized water, and dried. The yield is 49 grams (98% recovery). This dye is soluble in propylene glycol methyl ether acetate and aqueous alkali.

| Properties: | |
|---|---|
| Molecular weight: | 704.62 |
| Solubility: | Soluble in PGMEA |
| UV-visible: | The absorption maxima occur at 408 and 254 nm. The molar extinction coefficient at 436 nm (the g-line) is 3.25 × 10$^4$. |
| Melting Point: | The dye decomposes at 187° C. |
| Elemental analysis: | C = 53.98%, H = 3.03%, N = 12.62%, F = 15.23%. |
| High Performance Liquid Chromatography: | 89% major fraction; different tautomeric forms are possible. |

EXAMPLE 3

This example details the preparation of a dyestuff having the formula:

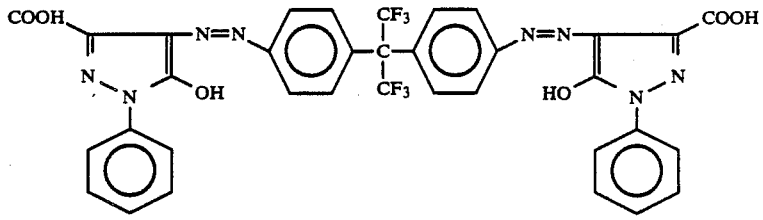

35.53 grams 3-carboxy-1-phenyl-2-pyrazolin-5-one, 100 ml water, and 26.4 grams aqueous sodium hydroxide (50%) solution are stirred together in a 250 ml Erlenmeyer flask, heated to 50° C., and held at 50° C. for two hours.

While the 3-carboxy-1-phenyl-2-pyrazolin-5-one is being prepared, 25.05 grams of 2,2-bis(4-aminophenyl) hexafluoropropane (hereinafter referred to as 4,4'-6F Diamine-95% assay); 300 ml water, and 38.28 grams concentrated (31.5%) hydrochloric acid are stirred together in a 800 ml beaker and cooled to 0° C. in an ice bath. To the diamine hydrochloride is added 27.0 grams of aqueous sodium nitrite (40%) solution. The mixture is kept at 0–5° C. and a positive test for nitrite concentration against Green's Reagent or potassium iodide starch paper is maintained for 1 hour. At the end of one hour, the excess nitrite of the tetraazonium salt is reacted away with sulfamic acid.

To the tetraazonium salt solution is added 8.2 grams sodium acetate. The pyrazolone solution is gradually dropped in until a diazo spot test against H-acid is negative. The mixture is warmed to 70° C. and acidified to about pH 1 with concentrated hydrochloric acid. The mixture is allowed to cool to room temperature while stirring. The product is filtered, washed with water, and dried. The yield is 51.4 grams (94% of theory).

The dye is purified by reprecipitation. 43.47 grams of dye is dissolved in a solution of about 450 ml deionized water and 28.7 grams sodium hydroxide (50%) solution in a 600 ml beaker. The solution is filtered and the filtrate subsequently is drowned into 1 liter of 1N-hydrochloric acid. The reprecipitated dye is filtered, washed with deionized water, and dried. The yield is 43.11 grams (99% recovery). This dye is soluble in propylene glycol methyl ether acetate and aqueous alkali.

| Properties: | |
|---|---|
| Molecular weight: | 764.59 |
| Solubility: | Soluble as a 2% solution in PGMEA. |
| U.V. Visible: | The absorption maxima occur at 420 and 252 nm. The molecular extinction coefficient at 436 nm (the g-line) is $3.9 \times 10^4$. |
| Melting Point: | Decomposes at 190° C. |
| Elemental Analysis: | C = 54.02%, H = 5.15%, N = 11.85%, F = 15.64%. |
| High Performance Liquid Chromatography: | 87% major fraction; different tautomeric forms are possible. |

EXAMPLE 4

This example details the preparation of a dyestuff having the formula:

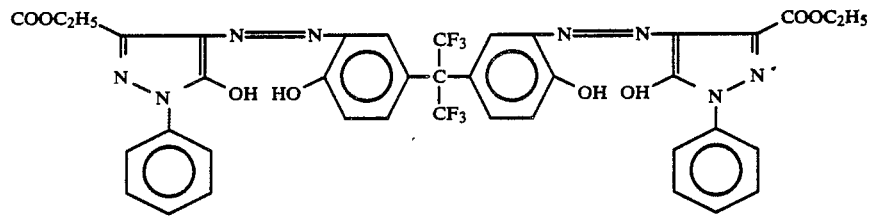

9.16 grams of 2,2-bis(3-amino 4-hydroxyphenyl) hexafluoropropane (hereinafter referred to as 6F-bisaminophenol), 75 ml deionized water, and 6.3 grams concentrated (31.5%) hydrochloric acid are stirred together in a 125 ml Erlenmeyer flask and cooled to 0° C. in an ice bath. To the diamine hydrochloride is added 18.3 grams of aqueous sodium nitrite (20%) solution. The mixture is kept at 0–5° C. and a positive test for nitrite concentration against Green's Reagent or potassium iodide starch paper is maintained for 1 hour. At one hour, the pH is raised to about 6.5 with sodium carbonate (10%) solution. The product is filtered onto a Buchner funnel and washed with deionized water. The product is stored in a freezer (about −30° C.) until used.

3.88 grams of bisquinonediazide prepared above is dissolved in 40 grams reagent grade methanol at room temperature. The solution is cooled to −5 to 0° C. 4.64 grams 3-carbethoxy-1-phenyl-2-pyrazolin-5-one is dissolved in 60 grams of reagent grade methanol and combined with the cold bisquinonediazide solution. The solution is stirred while 17 grams sodium acetate is added, and the temperature is allowed to rise to 25° C. After two hours at 25° C., 25 ml 1 N hydrochloric acid is dropped in causing the product to precipitate. More methanol and water are added. The product is filtered and washed with deionized water.

The wet cake is immediately purified by reprecipitation. The wet cake is dissolved in 200 ml deionized water and 30 ml 1 N sodium hydroxide in a 500 ml Erlenmeyer flask. The solution is filtered and drowned into 50 ml 1 N hydrochloric acid and 200 ml deionized water in a 1 liter beaker. The reprecipitated dye is filtered, washed with deionized water, and dried. The yield is 6.8 grams (80% of theory).

| Properties: | |
|---|---|
| Molecular weight: | 852.7 |
| Solubility: | Soluble in PGMEA |
| U.V.-visible: | The absorption mixima occur at 450 and 258 nm. The molar extinction coefficient at 436 nm is $4.1 \times 10^4$. |
| Melting point: | Decomposes at 189° C. |
| High Performance Liquid Chromatography: | 71% major fraction. Tautomeric forms are possible. |

EXAMPLE 5

This example details the preparation of a dyestuff having the formula:

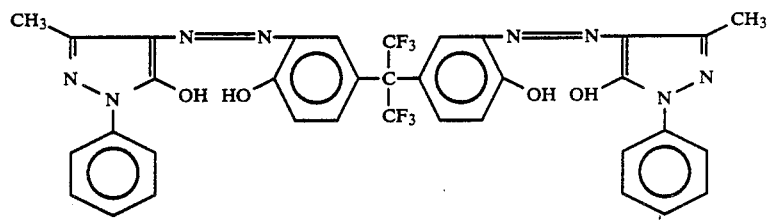

9.16 grams of 6F-bisaminophenol, 75 ml deionized water, and 6.3 grams concentrated (31.5%) hydrochloric acid are stirred together in a 125 ml Erlenmeyer flask and cooled to 0° C. in an ice bath. To the diamine hydrochloride is added 18.3 grams of aqueous sodium nitrite (20%) solution. The mixture is kept at 0–5° C. and a positive test for nitrite concentration against Green's Reagent or potassium iodide starch paper is maintained for 1 hour. At one hour, the pH is raised to about 6.5 with aqueous sodium carbonate (10%) solution. The product is filtered onto a Buchner funnel and washed with deionized water. The product is dried by pulling or drawing air through it overnight. The product is stored in a freezer (about −30° C.) until needed.

3.48 grams 3-methyl-1-phenyl-2-pyrazolin-5-one is dissolved in 50 grams reagent grade methanol at room temperature. 3.88 grams of bisquinonediazide prepared above is dissolved in 40 grams methanol at room temperature and added to the pyrazolone solution. The solution is stirred while 1.7 grams sodium acetate is added, and the temperature is allowed to rise from 23° C. to 31° C.

Thereafter 25 ml 1 N hydrochloric acid is dropped in. More methanol and water are added to precipitate the product in a manageable form. The product is filtered and washed with deionized water. The wet cake is immediately purified by reprecipitation.

The wet cake is dissolved in about 200 ml deionized water and 25 ml 1 N sodium hydroxide in a 500 ml Erlenmeyer flask. The solution is drowned into 50 ml 1 N hydrochloric acid and 50 ml deionized water in a 1 liter beaker. The reprecipitated dye is filtered, washed with deionized water, and dried. The yield is 6.7 grams (91% of theory).

| Properties | |
|---|---|
| Molecular weight: | 736.6 |
| Solubility: | Soluble in PGMEA |
| U.V.-visible: | The absorption maxima occur at 412 and 242 nm. The molar extinction coefficient at 436 nm is $3.8 \times 10^4$. |
| Melting Point: | Decomposes at 195° C. |
| High Performance Liquid Chromatography: | 99% assay |

The dyestuffs of the present invention are soluble in many organic solvents and may be accordingly used in photoresist or lithographic solvent based compositions as light absorbing chromophores or anti halation agents. They are particularly effective in alleviating the problem of reflective notching and poor line width control caused by back scattering of light off reflective surfaces in photoresist processes thereby greatly improving the image contrast and resolution in such processes. Generally the dyestuffs are incorporated into such compositions at a level of from about 0.5 to 15% by weight, based on the weight of non volatile components present in the composition. The preferred level of addition is from about 1 to about 10% by weight.

Examples of suitable resist systems in which the dyes of the present invention may be used include positive acting resist compositions containing a novolak, polyvinylphenol, or polyhydroxystyrene binder, a quinone diazide photosensitizer and a solvent. Sensitizers which may comprise a component of the U.V. resist compositions of the present invention are selected from the group of substituted naphthoquinone diazide sensitizers which are conventionally used in the art in positive photoresist formulations. Such sensitizing compounds are disclosed, for example in U.S. Letters Pat. Nos. 2,797,213; 3,106,465; 3,148,983; 3,130,047; 3,201,329; 3,785,825; and 3,802,885. Useful photosensitizers include naphthoquinone-(1,2)-diazide-5- sulfonyl chloride and with phenolic compounds such as hydroxy benzophenones.

In the preferred embodiment, the solid part of the photoresist composition, that is the resin and diazide, preferably ranges from 15% to about 99% resin and from about 1% to about 85% quinone diazide. The most preferred range of resin (such as novolak resin) would be from about 50% to about 90% and most preferably from about 65% to about 85% by weight of the solid resist parts. A more preferred range of the diazide would be from about 10% to about 50% and more preferably from about 15% to about 35% by weight of the solid resist parts. In manufacturing the resist composition the novolak and diazide are mixed with the solvent such that the solvent is present in an amount of from about 40% to about 90% by weight of the overall resist composition. A more preferred range is from about 60% to about 83% and a most preferred range is from about 65% to about 70% by weight of the overall resist composition.

The dyes may also be used in DUV and NUV resist systems based on resist chemistry wherein the in-situ generation of an acid group or derivative thereof as a consequence of exposure to actinic radiation serves to catalyze or initiate further chemical reaction in the resist system which causes a differentiation in the solubility properties of the exposed vs. the unexposed areas of the surface.

One of such systems involves the utilization of the dyes of this invention in combination with a polymer having recurring acid labile pendant groups and an onium salt or acid generator as disclosed in U.S. Pat. No. 4,491,628, the complete disclosure of which is incorporated herein by reference. This technology is based upon the utilization of vinylic polymer materials containing pendant groups, preferably carboxyl groups, which undergo acidolysis in the presence of an acid to produce products that are different in polarity (and consequently solubility) than their precursors. Examples of such polymers include poly (p-tert-butoxycarbonyl-alpha-methylstyrene), poly(p-tert-butoxycarbonyloxystyrene), poly (tert-butyl p-vinylbenzoate), poly (tert-butyl p-isopropylphenyl-oxyacetate and poly (tert-butyl methacrylate). Resist solutions may be prepared by dissolving the polymer in suitable solvent such as diglyme or cyclohexanone at a solids level within the range of from about 5 to 35% by weight, followed by the addition to the solution of the acid generating onium salt and dyestuff of this invention. The onium salt may be incorporated at a weight generally ranging from about 1 to about 100% by weight of polymer present in the solution, with the preferred level being from about 5 to about 50% by weight.

This solution may be spin coated onto a substrate such as a silicon wafer or metal sheet, the coated substrate baked to remove the solvent followed by exposure through a mask to selectively expose the resist film. Those portions of the resist exposed to radiation become soluble in aqueous alkaline developer or polar solvents due to cleavage of the acid labile pendant group of the polymer chain to form polar groups as a consequence of the reaction of the polymer with the strong acid generated in-situ. Those portions of the resist film not exposed to radiation remain unchanged and may be selectively removed by development with a non-polar solvent such as dichloromethane. Thus positive or negative images may be obtained depending on the identity of the developer solution.

Yet another resist system is based upon the use of copolymer resins containing an imide group, such as copolymers of styrene and meleimide wherein the maleimide component of the copolymer is blocked with an acid labile blocking group such as an oxycarbonyl group. Examples of such materials are disclosed in U.S. Pat. No. 4,837,124, the disclosure of which is incorporated herein by reference. These polymers are dissolved in suitable solvent and the acid generating agents and dyestuffs of this invention combined therewith in the proportions set forth above. When the dried resist film is exposed to radiation through a mask, the in-situ generation of the acid serves to cleave the blocking group present on the exposed portion of the polymer film rendering it soluble in aqueous alkali, while the non-exposed portion remains insoluble in the same aqueous alkali.

Similar systems based on copolymers of maleimide and aliphatic vinylesters and ethers are disclosed in U.S. Pat. No. 4,720,445. Other systems based on copolymers of vinyl aromatic monomers or vinyl ethers and monomers containing imide groups blocked by a methylol group which is further blocked to form an acetate or ketal moiety are disclosed in U.S. Pat. No. 4,810,613. The disclosure of each of these patents is incorporated herein by reference.

The dyestuffs of the present invention may also be employed in so called "Image Reversal" processes wherein a normally positive acting photoresist system can be made to function in a negative sense. An example of such a process is disclosed in U.S. Pat. 4,775,609, the complete disclosure of which is incorporated herein by reference. The resist system of this patent is based on a combination of a polymer blocked by an acid labile group such as N-tert-butoxycarbonyl maleimide/styrene copolymer and a latent photoacid material. When a positive resist of this type is exposed through a pattern mask, a photoacid is produced in the irradiated areas as a consequence of the generation of the strong acid. By treating the resist with a base such as ammonia vapor, the acid in the exposed areas is neutralized to a salt and the deblocking effect usually obtained in a subsequent baking step does not take place. The polymer remains unblocked and hydrophobic. The resist is then blanket exposed to produce photoacid in the previously unexposed areas and then processed to develop the image, which is negative rather than positive.

Similar image reversal systems based on novolac binder and diazoquinone or diazoketone photosensitizers are disclosed in U.S. Pat. No. 4,104,070, the disclosure of which is incorporated herein by reference.

The dyestuffs of the present invention may be also used in negative acting resist systems wherein a light activated acid derivative serves to initiate photopolymerization in exposed areas of compounds containing ethylenic unsaturation, or as a source of acid in curing acid-curable resins or resin compositions such as aminoplasts or phenolic resins. Examples of such systems are disclosed in U.S. Pat. Nos. 4,026,705 and 4,250,053, as well as European Patent Specification EP-A-0037512, the complete disclosures of which are incorporated herein by reference.

In carrying out the photoresist process, a layer of the composition from which the image is to be formed may be applied to a support from a solvent, e.g., 2-ethoxyethanol, 2-ethoxyethyl acetate, ethyl methyl ketone, N-methylpyrrolidinone, N,N-dimethylformamide, cyclopentanone, cyclohexanone, dyglyme, PGMEA, or mixtures thereof, in a conventional manner, such as by dipping, spinning, spraying, or by roller. The solvent is then allowed or caused to evaporate, e.g. by air drying or by heating to a temperature below that in which any heat-curable component is cured. The support is usually of copper, aluminum, or other metal, silicon, oxides or nitrides of silicon, synthetic resin or plastics, such as a film of a polyester, a polyamide, or polyolefin, paper, or glass, and is coated such that the layer, on drying, is about 1-250 micrometers thick.

Exposing the composition to actinic radiation in a predetermined pattern may be achieved by exposure through an image-bearing transparency consisting of substantially opaque and substantially transparent areas, or by means of a computer-controlled laser beam. Actinic radiation of 200-600 nm is generally used, and suitable sources include carbon arcs, mercury vapor arcs, fluorescent lamps with phosphors emitting ultra violet light, argon and xenon glow lamps, tungsten lamps, and photographic flood lamps; of these, mercury vapor arcs and metal halide lamps are the most suitable. The exposure time required depends on such factors as the nature of the composition employed, the thickness of the layer, the type of radiation source, and its distance from the layer; it is usually of the order of 30 seconds to 4 minutes, but a suitable duration can readily be found by routine experimentation.

After imagewise exposure, the layer of the composition is washed with developer to remove the exposed areas struck by radiation in the case of positive acting resists, or the non-exposed areas in the case of negative acting resists. Suitable developers include aqueous alkali solutions, organic alcohols and other solvents as are known in the art.

After development, the substrate may be used as such in the case of metal-based lithographic printing plates or it may be etched to remove metal or dielectric layers in the case of electronic circuit devices. Suitable etching procedures include reactive ion etching using an etch gas such as oxygen or a halogen-containing gas, or chemical etching using materials such as ferric chloride or ammonium persulfate solutions.

The dyestuffs of this invention may also be used in the preparation of solvent-based inks and as colorants for plastics, paper, and textiles. They generally exhibit good fastness to light, high tinctorial strength and good transparency.

What is claimed is:

1. A dyestuff soluble in organic solvent having the structure:

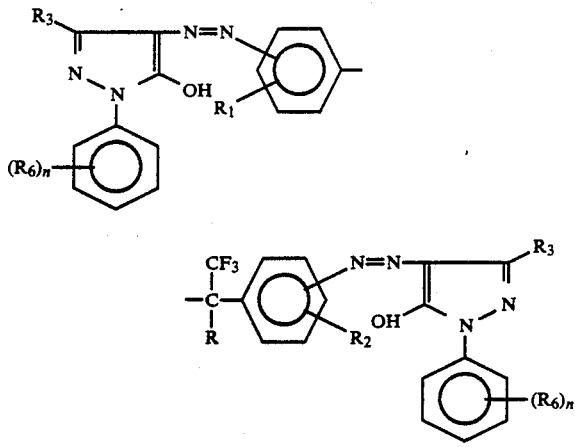

wherein R is $CF_3$ or phenyl, $R_1$ and $R_2$ are the same or different substituent groups selected from the group consisting of hydrogen, hydroxy, halogen, $C_1$ to $C_3$ alkyl and $C_1$ to $C_4$ alkoxy, $R_3$ is selected from the group consisting of hydrogen, $C_1$ to $C_3$ alkyl, $C_1$ to $C_3$ alkoxy, COOH, and $COOR_5$ wherein $R_5$ is $C_1$ to $C_4$ alkyl, $R_6$ is selected from the group consisting of hydrogen, sulfo, $C_1$ to $C_3$ alkyl, $C_1$ to $C_3$ alkoxy and halogen, and n is zero or a whole number ranging from 1 to 3.

2. The dyestuff of claim 1 wherein R is $CF_3$.

3. The dyestuff of claim 2 wherein the azo linkages are each meta and the $R_1$ and $R_2$ groups are each para with respect to the isopropylidene linking group.

4. The dyestuff of claim 2 wherein the azo linkages are each para and the $R_1$ and $R_2$ groups are each meta with respect to the isopropylidene linking group.

5. The dyestuff of claim 2 wherein $R_3$ is methyl.

6. The dyestuff of claim 2 wherein $R_3$ is COOH.

7. The dyestuff of claim 2 wherein $R_3$ is $COOR_5$.

8. The dyestuff of claim 7 wherein $R_5$ is a $C_2$ alkyl.

9. The dyestuff of claim 2 wherein $R_1$ and $R_2$ are each hydrogen.

10. The dyestuff of claim 2 wherein $R_1$ and $R_2$ are each hydroxy.

11. The dyestuff of claim 10 wherein said hydroxy groups are para and said azo linkages are meta with respect to said isopropylidene linking group.

12. The dyestuff of claim 1 wherein said solvent is propylene glycol methyl ether acetate.

13. The dyestuff of claim 1 dissolved in organic solvent.

* * * * *